United States Patent
Hirano

(10) Patent No.: US 6,774,561 B2
(45) Date of Patent: Aug. 10, 2004

(54) LIGHT-EMITTING DEVICE AND PROCESS FOR PRODUCTION THEREOF HAVING AN EMISSION LASER HELD BETWEEN ELECTRODES

(75) Inventor: Takashi Hirano, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/221,494

(22) PCT Filed: Jan. 10, 2002

(86) PCT No.: PCT/JP02/00094
§ 371 (c)(1),
(2), (4) Date: Sep. 13, 2002

(87) PCT Pub. No.: WO02/056641
PCT Pub. Date: Jul. 18, 2002

(65) Prior Publication Data
US 2003/0132434 A1 Jul. 17, 2003

(30) Foreign Application Priority Data
Jan. 15, 2001 (JP) .................................. P2001-006383

(51) Int. Cl.[7] ........................... H01L 35/24; H01L 29/00
(52) U.S. Cl. ........................... 313/503; 257/40; 257/43; 257/99; 257/103; 313/504; 313/506
(58) Field of Search ............................... 313/503, 506, 313/509, 504, 505; 257/40, 43, 52, 80, 98, 99, 100, 103

(56) References Cited

U.S. PATENT DOCUMENTS 6,366,017 B1 * 4/2002 Antoniadis et al. ......... 313/506

FOREIGN PATENT DOCUMENTS

| EP | 0 880 306 A1 | 11/1998 |
|---|---|---|
| JP | 5-174975 | 7/1993 |
| JP | 6-310280 | 4/1994 |
| JP | 7-130468 | 5/1995 |
| JP | 8-222373 | 8/1996 |
| JP | 10-308285 A1 | 11/1998 |
| JP | 11-67459 | 3/1999 |
| JP | 2000-260572 A1 | 9/2000 |
| WO | WO-98/10473 A1 | 3/1998 |

OTHER PUBLICATIONS

Australian Examinantion Report.

* cited by examiner

Primary Examiner—Minhloan Tran
Assistant Examiner—Tan Tran
(74) Attorney, Agent, or Firm—Rader, Fishman & Grauer PLLC; Ronald P. Kananen

(57) ABSTRACT

A light-emitting device of a top-emission type maintains a stable emission efficiency without leakage current consists of a substrate (1), a lower electrode (4), an organic layer (6) which includes at least an emission layer (6c), and a transparent upper electrode (7) provided on the organic layer (6), which are sequentially formed on top of the other. The lower electrode (4) has a double-layer structure composed of a metallic layer (2c) and a buffering thin film (3c) formed thereon. The buffering thin film (3c) is formed from either an oxide of the metallic material constituting the metallic layer (2c), the oxide having a higher conductivity than the organic layer (6), or an oxide of chromium. The thus-formed buffering thin film (3c) reduces the surface roughness of the metallic layer (2c) in the lower electrode (4) of double-layer structure. The reduced surface roughness provides a uniform space between the lower electrode (4) and the transparent upper electrode (7).

13 Claims, 3 Drawing Sheets

LIGHT-EMITTING DEVICE AND PROCESS FOR PRODUCTION THEREOF HAVING AN EMISSION LASER HELD BETWEEN ELECTRODES

TECHNICAL FIELD

The present invention relates to a light-emitting device and a process for production thereof and, more particularly, to a light-emitting device having an emission layer held between electrodes and a process for production thereof.

BACKGROUND ART

An organic electroluminescence (referred to as EL hereinafter) device, which is a spontaneous light-emitting device (referred to as light-emitting device hereinafter), has an organic film including an organic emission layer between an anode and a cathode. FIG. 4 is a sectional view showing the structure of one example of such light-emitting devices. The light-emitting device shown in this figure has a lower electrode 102 as an anode of metallic material formed on a substrate 101 and an organic layer 106 including an organic hole injection layer 103, an organic hole transporting layer 104, and an organic emission layer 105 or the like, which are sequentially laid one over the other on the lower electrode 102. And, on this organic layer 106 is formed an upper electrode 107 as a cathode which is a thin film of metallic material transparent to light and is further formed a transparent conductive film 108 to reduce the resistance of the upper electrode 107 as a cathode.

The light-emitting device of such structure is a display element of so-called "top emitting type", which works in such a way that the light generated by the organic emission layer 105 is reflected by the lower electrode 102 of metallic material and is allowed to emanate through the upper electrode 107 placed opposite to the substrate 101.

Moreover, production of the light-emitting device of such structure starts with forming a layer of metallic material on the substrate 101 by any process adequately selected from various processes such as sputtering, resistance heating vapor deposition, and electron beam vapor deposition, and forming the lower electrode 102 by patterning the layer of metallic material. Subsequent steps are sequential deposition of materials for the organic layers 103 to 105, the upper electrode 107, and the transparent conductive film 108 through a deposited mask, and the deposition is followed by patterning to form the organic layer 106, the upper electrode 107, and the transparent conductive layer 108.

However, the display device and the process for production thereof as mentioned above have the following problem. Namely, all the layers of metallic material tend to have polycrystalline structure no matter whether they are formed by sputtering, resistance heat vapor deposition, or electron beam vapor deposition. As the result, the lower electrode 102 formed by patterning the layer of metallic material has projections on its surface due to marked surface roughening, as shown in FIG. 5 (an enlarged sectional view), although not so serious as the transparent anode formed from ITO (indium tin oxide).

Consequently, the organic layer 106 formed on the lower electrode 102 becomes locally thin at spots corresponding to projections, with the result that the distance d across the organic layer 106 between the lower electrode 102 and the upper electrode 107 becomes locally short and the electric field concentrates at such spots to cause leakage current.

This leakage current does not help the light-emitting device to emit light but decreases the efficiency of the light-emitting device. Moreover, extremely concentrated leakage current results in a short circuit between the lower electrode 102 and the upper electrode 107, thereby disabling the light-emitting device from light emission. This is the cause for non-emitting spots so-called dark spots in the organic EL display.

A possible way to prevent leakage current is to form the lower electrode 102' from an electrically conductive material, such as chromium oxide, which gives a flat film surface, as shown in FIG. 6. However, the electrically conductive material in oxide form has a low reflectivity and readily transmits light, so that the lower electrode 102' made of the electrically conductive material permits the light h reaching it from the emission layer 105 as one of the organic layers 106 to be absorbed toward the substrate 101. This results in a decrease in the amount of light h emanating from the upper electrode 107, which in turn leads to a decease in emission efficiency.

It is an object of the present invention to provide a light-emitting device of top emission type and a process for production thereof, the light-emitting device keeping a stable emitting efficiency without leakage current.

DISCLOSURE OF INVENTION

The present invention to achieve the above-mentioned object covers a light-emitting device composed of a lower electrode which is laid on a substrate, an organic layer including at least an emission layer which is laid on the lower electrode, and an upper electrode transparent to light which is laid on the organic layer, characterized in that the lower electrode is of laminate structure consisting of a metallic material layer and a layer of buffering thin film which is formed on the metallic material layer. The buffering thin film is made of any oxide of the metallic material constituting the metallic material layer, the oxide having a higher conductivity than the organic layer, or made of an oxide of chromium.

Also, according to the present invention, the light-emitting device is produced by a process including steps of forming a lower electrode on a substrate, forming on the lower electrode an organic layer including an emission layer, and forming above the substrate an upper electrode transparent to light such that the emission layer is held between the lower electrode and the upper electrode, characterized in that the step of forming the lower electrode includes additional steps of forming a buffering thin film on a metal film formed on the substrate and patterning the metal film and buffering thin film, thereby forming the lower electrode of laminate structure consisting of the metallic material layer and the buffering thin film. The buffering thin film is made of any oxide of the metallic material constituting the metal layer, the oxide having a higher conductivity than the organic layer, or made of an oxide of chromium.

The above-mentioned light-emitting device and production process are characterized in that the surface layer of the lower electrode is a buffering thin film which is made of any oxide of the metal constituting the underlying metallic material layer, the oxide having a higher conductivity than the organic layer, or made of an oxide of chromium. In general, a metal film has a rough surface due to polycrystalline structure, whereas a film of an oxide of the metallic material constituting the metal film has a less rough surface. In addition, a buffering thin film made of an oxide of chromium has a less rough surface than the metal film independently of the metal film underneath. Moreover, the buffering thin film functions as the lower electrode if it is made of any oxide of the metal constituting the metallic material layer, the oxide having a higher conductivity than the organic layer, or made of a chromium oxide which has the highest conductivity among oxides. Thus, the foregoing structure ensures a uniform space between the lower electrode whose metallic material layer has a mildly rough surface owing to the buffering thin film layer constituting the surface layer and the upper electrode transparent to light which is laid on the lower electrode with an organic layer interposed between them.

BEST MODE FOR CARRYING OUT THE INVENTION

According to the present invention, the display device and the process for production thereof are embodied as explained in the following with reference to the accompanying drawings.

Figure 1A:
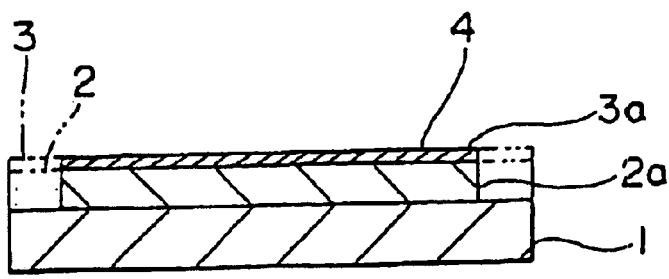
FIGS. 1A to 1D are sectional views showing the process for producing the light-emitting device pertaining to the embodiment of the present invention.

The light-emitting device of top emission type in one embodiment of the present invention is produced through consecutive steps shown in FIGS. 1A to 1D. The first step shown in FIG. 1A is to coat a substrate 1 of quartz glass or the like, which has been cleaned previously, with a metal film 2 of chromium (Cr) or the like by sputtering. The metal film 2 has a high work function and acts as an anode afterward. Sputtering is carried out in an atmosphere of argon (Ar) at about 0.2 Pa, with a DC output of 300W. The Cr film (metal film) 2 about 200 nm thick is formed by sputtering.

The metal film 2 with a high work function may be formed from, in addition to Cr, molybdenum (Mo), tungsten (W), tantalum (Ta), niobium (Nb), nickel (Ni), platinum (Pt), or the like.

The metal film 2 formed as mentioned above assumes the polycrystalline structure irrespective of its raw material and film-forming method and hence has a considerably rough surface with projections.

Subsequently, the metal film 2 is coated with a buffering thin film 3 which features the present invention. The buffering thin film 3 is a film of an oxide of chromium or any metallic material constituting the metal film 2. It should preferably be formed from chromium oxide because it constitutes the lower electrode together with the metal film 2 and needs to have higher conductivity than the organic layer to be formed later. Chromium oxide is desirable for high conductivity. Moreover, it is desirable to form the buffering thin film 3 in the same chamber as used to form the metal film 2 without exposing the substrate 1 to air.

In this embodiment, the buffering thin film 3 is formed by sputtering which employs argon (Ar) and oxygen ($O_2$) as the sputtering gas. Argon and oxygen are mixed such that they develop equal partial pressures and their total pressure is about 0.3 Pa. Sputtering is carried out with a DC output of 300 W. In this way there is obtained the buffering thin film 3 of chromium oxide ($CrO_2$) with a prescribed thickness (10 nm, for example). The film thickness may be adequately controlled by the duration of sputtering. Incidentally, the chromium oxide is not limited in composition to $CrO_2$; but it may embrace other chromium oxide such as $Cr_2O_3$ so long as sputtering is carried out properly.

It is also possible to form the buffering thin film 3 by thermal oxidation. A chromium oxide ($Cr_2O_3$) film with a prescribed thickness (8 nm, for example) is obtained by heat treatment at 350° C. in an atmosphere of oxygen. The film thickness depends on the duration of heat treatment. As in sputtering, the chromium oxide will have a composition of $CrO_2$ if the condition of heat treatment is properly adjusted.

The foregoing shows an instance in which the buffering thin film 3 is formed from chromium oxide. However, the buffering thin film 3 can also be formed from other metal oxides, such as molybdenum oxide ($MoO_2$ and $Mo_2O_5$) and nickel oxide (NiO), which have good conductivity. As in the case of using chromium oxide, these metal oxides are obtained by sputtering with an oxygen-containing sputter gas under adequate conditions.

Now, the buffering thin film 3 has its thickness established on its refractive index and conductivity and also on what is required of the display unit in which the light-emitting device is incorporated.

In other words, if the display unit is required to have a certain level of luminance, the buffering thin film 3 should be as thin as possible (about 10 nm, for example) so long as it covers the surface roughness of the metal film 2. On the other hand, if the display unit is required to have a certain level of contrast, the buffering thin film 3 should be rather thick (100 nm or above 100 nm) so long as it has no effect on the efficiency of hole injection from the lower metal electrode which is formed later by pattering the metal film 2.

Subsequently, the buffering thin film 3 with a prescribed thickness as mentioned above is given a resist pattern (not shown) by photolithography. Etching through this resist pattern as a mask is performed on the buffering thin film 3 and the metal film 2. This etching is wet etching with ETCH-1 (made by Sanyo Chemical Industries, Ltd., trade name) as an etchant which ensures accurate and reproducible patterning. Patterning leaves the layer 2a of the metal film 2 and the buffering thin film layer 3a of the buffering thin film 3, which constitute the lower electrode 4 of laminate structure. This lower electrode 4 acts as an anode.

The lower electrode 4 is formed in stripe shape extending in the depthwise direction of the drawing, in the case where the light-emitting device is incorporated into a display unit of simple matrix type. On the other hand, the lower electrode 4 is formed in conformity with each pixel connected to a thin-film transistor (not shown), in the case where the light-emitting device is incorporated into a display unit of active matrix type.

Figure 1B:
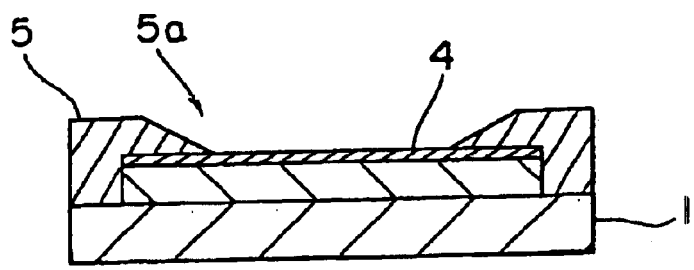

The next step shown in FIG. 1B is to form on the substrate 1 an insulating layer 5 having an opening 5a in contact with the lower electrode 4. This step is achieved by forming a silicon oxide ($SiO_2$) film (600 nm thick) by sputtering and then making the opening 5a therein by wet etching through a resist pattern formed thereon by photolithography. This wet etching employs an aqueous mixture of hydrofluoric acid (HF) and ammonium fluoride ($NH_4F$) as an etchant.

The insulating layer 5 should be formed in such a way that it covers the periphery of the lower electrode 4. In addition, it may be formed from any material other than silicon oxide, and it and its opening may be formed by any other method than sputtering and wet etching mentioned above.

Incidentally, the insulating layer 5 is intended to positively isolate the lower electrode 4 from the upper electrode transparent to light which is formed later. Therefore, it is not necessarily essential if the light-emitting device is incorporated into a display unit which has a means to isolate the lower electrode 4 from the upper electrode transparent to light.

Figure 1C:
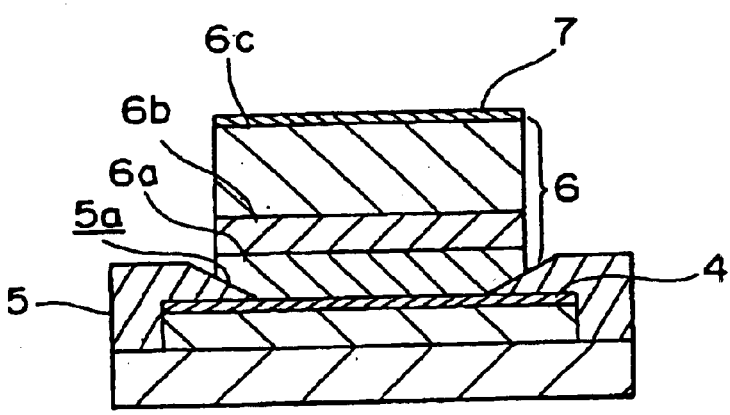

The third step shown in FIG. 1C is to form on the lower electrode 4 an organic layer 6 and a transparent upper electrode 7 by vapor deposition in a vacuum evaporation apparatus. Materials for the organic layer and upper electrode are sequentially deposited through a mask (not shown) placed on the substrate 1. The organic layer 6 and the transparent upper electrode 7 should be formed in such a way that they overlap with the periphery of the opening 5a of the insulating layer 5 so that they surely cover the bottom of the opening 5a of the insulating layer 5.

The organic layer 6 is composed of a hole injection layer 6a (30 nm thick) formed from 4,4,4-tris(3-methylphenylamino)triphenylamine (MTDATA), a hole transporting layer 6b (20 nm thick) formed from bis(N-naphthyl)-N-phenylbenzidine (α-NPD), and an emission layer 6c (50 nm thick) formed from 8-quinolinol aluminum complex (Alq3). The transparent upper electrode 7 (10 nm thick) is a cathode with a low work function; it is formed by vapor deposition from a transparent material which is an alloy of magnesium (Mg) and silver (Ag). Vapor deposition is carried out such that Mg deposits nine times faster than Ag.

Prior to vapor deposition, each boat for resistance heating is charged with 0.2 g of each material constituting the organic layer 6, 0.1 g of Mg, and 0.4 g of Ag. Then, each boat is attached to the electrode in the vacuum evaporation apparatus. The substrate 1 covered with a mask is mounted in the chamber of the vacuum evaporation apparatus. With the chamber evacuated to $1.0 \times 10^{-4}$ Pa, the boats are sequentially heated by voltage application.

The mask for vapor deposition, which has stripy openings, is placed on the substrate 1 in such a way that the stripy opening overlaps with and encloses the opening 5a of the insulating layer 5. The mask should be placed such that its opening intersects the lower electrode 2 at right angles.

Figure 1D:
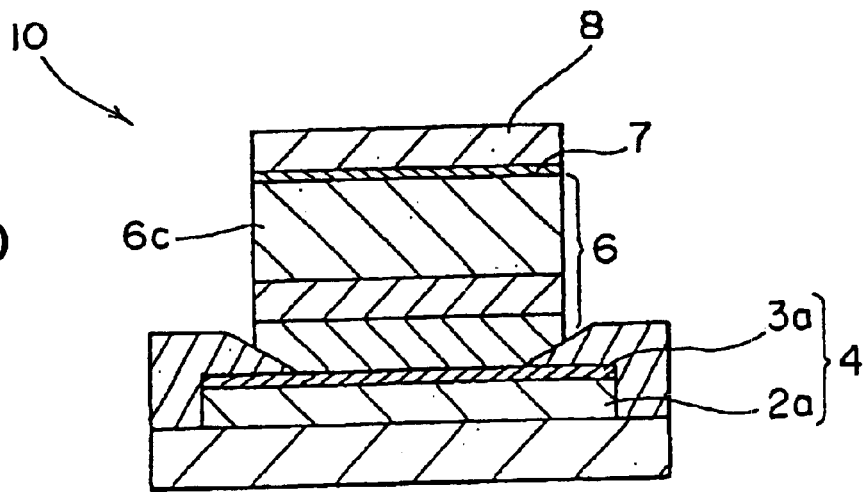

The fourth step shown in FIG. 1D is to form on the transparent upper electrode 7 by sputtering a transparent conductive film 8 which lowers the resistance of the transparent upper electrode 7. Sputtering is performed on the masked substrate 1 which has been moved into another chamber. The transparent conductive film 8, which is 200 nm thick, is formed from indium-zinc oxide (In—Zn—O) which has good conductivity at room temperature. The condition of sputtering is as follows: sputtering gas: a 1000:5 mixture of argon (Ar) and oxygen ($O_2$) by volume; chamber pressure: 0.3 Pa; and electric power: 40 W, DC.

Incidentally, the transparent film 8 is intended to reduce the resistance of the transparent upper electrode 7. Therefore, it is not necessarily essential so long as the transparent upper electrode 7 remains transparency despite its low resistance.

In the case where the light-emitting device is incorporated into a display unit of active matrix type, the transparent upper electrode 7 and the transparent conductive film 8 do not need patterning. In other words, they may be a continuous film. In this case, the transparent upper electrode 7 and the transparent conductive film 8 should be formed, with the deposition mask removed from the substrate 1, after the organic layer 6 has been formed.

The procedure mentioned above yields the light-emitting device 10 which consists of the lower electrode 4 including the metallic layer 2a and the buffering thin film 3a of chromium oxide laid on top of the other, the organic layer 6, the transparent upper electrode 7, and the transparent conductive film 8.

The light-emitting device 10 constructed as mentioned above emits light upon recombination of electrons and holes in the emission layer 6c of the organic layer 6, electrons being injected from the transparent upper electrode 7 as the cathode and holes being injected from the lower electrode as the anode. The light is allowed to emanate through the transparent upper electrode 7 (top emission type).

The light-emitting device 10 has the lower electrode 4 of double-layer structure consisting of the metal layer 2a of chromium and the buffering thin layer 3a of chromium oxide which are laid on top of the other. In general, a metal film 2 formed from a metal oxide is smoother than a metal film 2 formed from the metal of the metal oxide because the latter film assumes polycrystalline structure. Especially, a film formed from chromium oxide is smaller in surface roughness than any film formed from a metallic material as an electrode.

The buffering thin film layer 3a functions as the lower electrode if it is formed from any one more conductive than the organic layer among metal oxides constituting the metallic layer 2a, particularly from a chromium oxide which is most conductive among metal oxides.

Therefore, the lower electrode 4 is constructed such that the metallic layer 2a has its surface roughness reduced by the buffering thin layer 3a constituting the surface layer. This results in a uniform space between the lower electrode 4 and the transparent upper electrode 7, with the organic layer 6 interposed between them.

The consequence is elimination of concentrated electric fields between the lower electrode 4 and the transparent upper electrode 7 and elimination of leakage current and dark spots due to extremely concentrated electric fields. The resulting light-emitting device of top emission type maintains a stable emission efficiency.

The buffering thin film layer 3a formed from a highly conductive chromium oxide effectively reduces the concentration of electric field at projections on the surface of the metallic layer 2a. Moreover, it permits holes to be injected into the organic layer 6 from the metallic layer 2a so long as it is not thicker than a certain limit. This leads to the constant emission efficiency. The buffering thin film layer 3a can be formed with a minimum of additional steps if its raw material is an oxide of the metal for the metallic layer 2a. In this case, the production process simply needs addition of oxygen to the sputter gas for the metal film 2.

Figure 2:
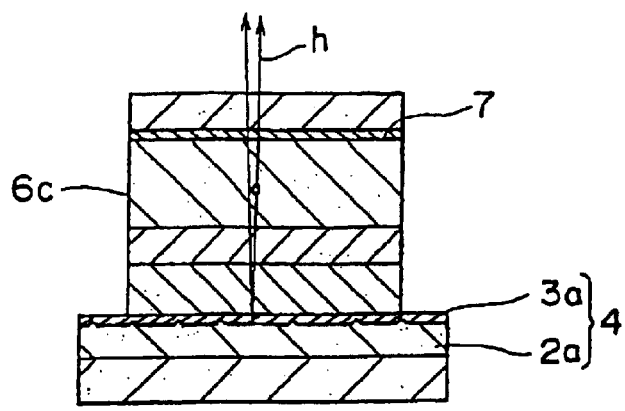
FIG. 2 is a sectional view showing the first light-emitting device obtained by the production process pertaining to the embodiment of the present invention.

The buffering thin film layer 3a of oxide constituting the lower electrode 4 may be formed rather thin, as shown in FIG. 2. In this case, it merely absorbs a minimum amount of the light h emitted from the emission layer 6c. This contributes to efficient light emission through the transparent upper electrode 7. Thus, the resulting light-emitting device has a high luminance.

Figure 3:
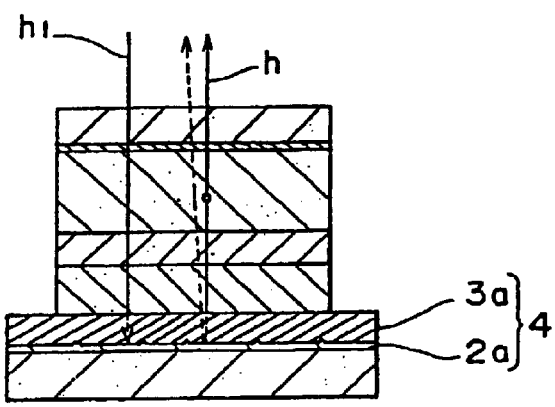
FIG. 3 is a sectional view showing the second light-emitting device obtained by the production process pertaining to the embodiment of the present invention.
Figure 4:
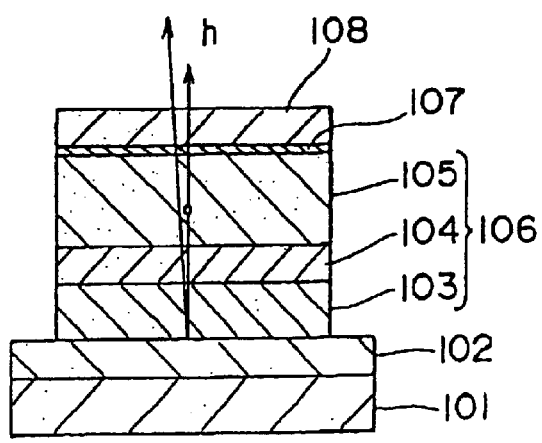
FIG. 4 is a sectional view showing a conventional light-emitting device.
Figure 5:
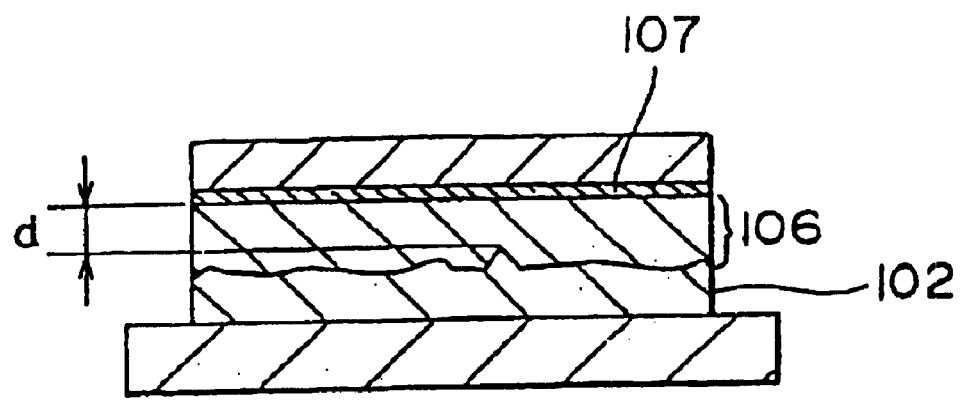
FIG. 5 is an enlarged sectional view showing subjects encountered in conventional light-emitting devices.
Figure 6:
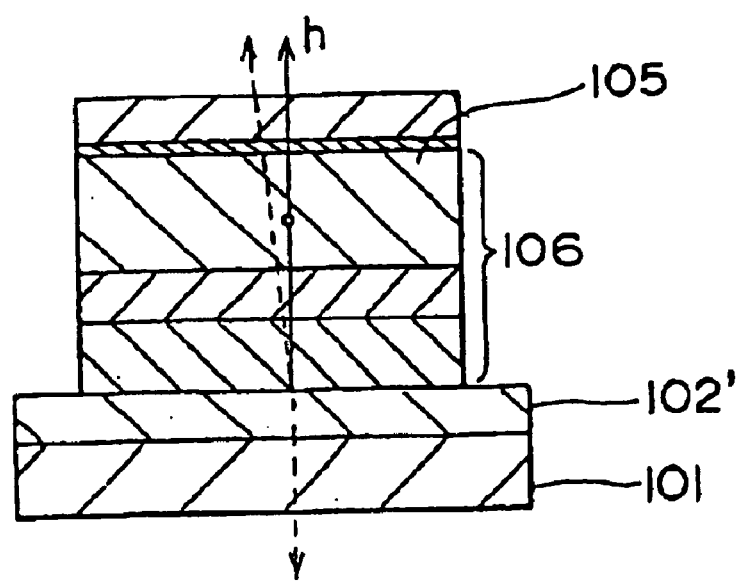
FIG. 6 is a sectional view showing another example of conventional light-emitting devices.

By contrast, the buffering thin film layer 3a of oxide constituting the lower electrode 4 may be formed rather thick, as shown in FIG. 3. In this case, it absorbs a certain amount of the light h emitted from the emission layer 6c. This slightly decreases the efficiency of light emission through the transparent upper electrode 7. Nevertheless, the resulting light-emitting device has good contrast because the buffering thin film layer 3a prevents reflection of the external light h1 entering through the transparent upper electrode 7. Thus, the resulting light-emitting device has a high contrast.

Two kinds of light-emitting devices ① and ② were obtained according to the above-mentioned embodiment, and two kinds of light-emitting devices ③ and ④ were prepared according to the conventional technology. They differ only in the structure of the lower electrode as specified below.

Light-emitting device ① . . . The lower electrode is a laminate consisting of a chromium layer and a buffering thin film (10 nm thick) of chromium oxide ($CrO_2$) formed thereon by sputtering.

Light-emitting device ② . . . The lower electrode is a laminate consisting of a chromium layer and a buffering thin film (8 nm thick) of chromium oxide ($Cr_2O_3$) formed thereon by thermal oxidation.

Light-emitting device ③ . . . The lower electrode is a single layer of ITO.

Light-emitting device ④ . . . The lower electrode is a single layer of chromium.

Each light-emitting device has an emitting area of 4 $mm^2$. Forty pieces of each light-emitting device were prepared. They were examined for occurrence of short-circuit between the upper and lower electrodes and also for current and luminance produced by voltage application (80 V). Luminance was measured through the upper electrode. The results of evaluation are shown in Table 1 below.

TABLE 1

|  | Occurrence of short-circuit | Current (mA/$cm^2$) | Luminance (cd/$m^2$) |
| --- | --- | --- | --- |
| Light-emitting device ① | 0 (out of 40) | 20 | 870 |
| Light-emitting device ② | 2 (out of 40) | 16 | 710 |
| Light-emitting device ③ | 16 (out of 40) | 23 | 250 |
| Light-emitting device ④ | 8 (out of 40) | 20 | 900 |

It is noted from Table 1 that light-emitting devices ① and ② according to the embodiment of the present invention suffer less occurrences of short-circuit as compared with light-emitting devices ③ and ④ according to the conventional technology. This proves that the buffering thin film layer reduces the surface roughness of the metallic layer, thereby preventing the concentration of electric field. It is also noted that light-emitting devices ① and ② have almost the same amount of current as light-emitting devices ③ and ④ despite the buffering thin film formed on the metallic layer. It is also noted that light-emitting devices ① and ② are comparable in luminance to light-emitting device ④ which permits efficient emission through the transparent upper electrode.

Incidentally, the above-mentioned embodiment demonstrated a light-emitting device in which the lower electrode 4 is an anode and the transparent upper electrode 7 is a cathode. However, the present invention can also be applied to a light-emitting device in which the lower electrode 4 is a cathode and the transparent upper electrode 7 is an anode. The latter produces the same effect as the former, provided that the lower electrode 4 and the transparent upper electrode 7 are formed from adequate materials and the organic layer 6 is formed in adequate structure from layers laminated in proper order. In this case, too, the buffering thin film layer on the lower electrode 4 should preferably be made of highly conductive material.

As mentioned above, the light-emitting device according to the present invention has the buffering thin film layer formed on the lower electrode which reduces the surface roughness of the metallic layer. The reduced surface roughness ensures a uniform space between the lower electrode and the transparent upper electrode with the organic layer interposed between them. The uniform space in turn prevents local concentration of electric fields and occurrence of leakage current and dark spots. These advantages lead to the light-emitting device of top emission type which maintains a stable emission efficiency.

What is claimed is:

1. A light-emitting device composed of a lower electrode that is laid on a substrate, an organic layer including at least an emission layer that is laid on said lower electrode, and an upper electrode transparent to light that is laid on said organic layer, characterized in that said lower electrode is of a laminate structure consisting of a metallic-material layer and a layer of buffering thin film which is formed on said metallic-material layer, said buffering thin film being made of any oxide of the metallic material constituting the metallic-material layer, said oxide having a higher conductivity than the organic layer.

2. The light-emitting device as set forth in claim 1, wherein said laminate structure consists of a metal layer of chromium and a buffering thin layer of chromium oxide.

3. The light-emitting device as set forth in claim 1 wherein said metal film is smoother than the metal film formed from the metal of a metal oxide because the latter film assumes a polycrystalline structure.

4. A light-emitting device composed of a lower electrode that is laid on a substrate, an organic layer including at least an emission layer that is laid on said lower electrode, and an upper electrode transparent to light that is laid on said organic layer, characterized in that said lower electrode is of a laminate structure consisting of a metallic-material layer and a layer of buffering thin film which is formed on said metallic-material layer, said buffering thin film being made of an oxide of chromium.

5. A process for producing a light-emitting device including the steps of forming a lower electrode on a substrate, forming on said lower electrode an organic layer with an emission layer, and forming above the substrate an upper electrode transparent to light such that the emission layer is held between the lower electrode and the upper electrode, characterized in that the step of forming the lower electrode includes the additional steps of forming a buffering thin film on a metal film formed on the substrate and patterning the metal film and buffering thin film, thereby forming the lower electrode of laminate structure consisting of the metallic-material layer and the buffering thin film, said buffering thin film being made of any oxide of the metallic-material constituting the metallic-material layer, said oxide having a higher conductivity than the organic layer.

6. The process for producing a light-emitting device as defined in claim 5, wherein the step of forming the buffering thin film immediately follows the step of forming the metal film by supplying a prescribed gas and employs said prescribed gas which is incorporated with oxygen.

7. A process for producing a light-emitting device including the steps of forming a lower electrode on a substrate, forming on said lower electrode an organic layer with an emission layer, and forming above the substrate an upper electrode transparent to light such that the emission layer is held between the lower electrode and the upper electrode, characterized in that the step of forming the lower electrode includes the additional steps of forming a buffering thin film of chromium oxide on a metal film formed on the substrate and patterning the metal film and buffering thin film, thereby forming the lower electrode of a laminate structure consisting of the metallic-material layer and the buffering thin film.

8. The process for producing a light-emitting device as defined in claim 7, wherein the step of forming the buffering thin film includes the step of forming an oxide of chromium.

9. A light-emitting device, comprising:
- a substrate:
- a metal film on said substrate with a high work function to act as a component of a lower electrode for said device, said metal film having a polycrystalline structure to thus have a rough surface with projections;
- a buffering thin film on said metal film to form, with said metal film, said lower electrode acting as said anode;
- an insulating layer having an opening in contact with said lower electrode;
- an organic layer on said lower electrode, said organic layer having a hole-injection layer, a hole-transporting layer, and an emission layer; and
- a transparent upper electrode acting as a cathode for said device with a low work function.

10. The light-emitting device as set forth in claim 9, further including: a transparent upper film formed on said transparent upper electrode to lower the resistance of the transparent upper electrode.

11. The light-emitting device as set forth in claim 9, wherein said metal film is chromium and said buffering film is a film of an oxide of chromium.

12. The light-emitting device as set forth in claim 9, wherein said metal film has a higher conductivity than said organic film, and said buffering layer is an oxide of a metal of said metal film.

13. The light-emitting device as set forth in claim 9, wherein a thickness of said buffering layer depends on its refractive index, its conductivity, and is between about 10 nm. so long as the buffering film covers the surface roughness of the metal film, and greater than 100 nm, so long as the thickness has no effect on the efficiency of hole injections from the lower metal electrode.

* * * * *